United States Patent [19]

Lin et al.

[11] Patent Number: 4,952,285
[45] Date of Patent: Aug. 28, 1990

[54] ANTI-TARNISH TREATMENT OF METAL FOIL

[75] Inventors: Lifun Lin; Chung-Yao Chao, both of Hamden; Ned W. Polan, Madison, all of Conn.

[73] Assignee: Olin Corporation, New Haven, Conn.

[21] Appl. No.: 456,038

[22] Filed: Dec. 22, 1989

Related U.S. Application Data

[63] Continuation of Ser. No. 338,711, Apr. 14, 1989, abandoned.

[51] Int. Cl.$^5$ ............................ C25D 5/48; C25D 7/06
[52] U.S. Cl. ......................................... 204/27; 204/35.1
[58] Field of Search ................................. 204/27, 35.1

[56] References Cited

U.S. PATENT DOCUMENTS

| | | | |
|---|---|---|---|
| 2,030,601 | 2/1936 | McDonald | 428/472.1 |
| 2,412,543 | 12/1943 | Tanner | 204/35.1 |
| 2,418,608 | 4/1947 | Thompson | 428/472.1 |
| 2,647,865 | 8/1953 | Freud | 204/33 |
| 3,625,844 | 12/1971 | McKean | 204/140 |
| 3,677,828 | 7/1972 | Caule | 148/253 |
| 3,716,427 | 2/1973 | Caule | 156/630 |
| 3,764,400 | 10/1973 | Caule | 148/258 |
| 3,853,716 | 12/1974 | Yates et al. | 204/28 |
| 4,131,517 | 12/1978 | Mitsuo et al. | 204/27 |
| 4,387,006 | 6/1983 | Kajiwara et al. | 204/32.1 |
| 4,432,846 | 2/1984 | Honeycutt, III | 204/129.95 |
| 4,468,293 | 8/1984 | Polan et al. | 204/27 |
| 4,515,671 | 5/1985 | Polan et al. | 204/228 |
| 4,549,950 | 10/1985 | Polan et al. | 204/206 |
| 4,647,315 | 3/1987 | Parthasarathi et al. | 148/258 |

FOREIGN PATENT DOCUMENTS

2030176A 4/1980 United Kingdom .
2073779A 10/1981 United Kingdom .

OTHER PUBLICATIONS

U.S. Patent Application Ser. No. 333,212 filed Apr. 5, 1989, L. Lifun and N. W. Polan.
U.S. Patent Application Ser. No. 333,210 filed Apr. 5, 1989, L. Lifun and N. W. Polan.

Primary Examiner—T. M. Tufariello
Attorney, Agent, or Firm—H. Samuel Kieser

[57] ABSTRACT

A method of imparting tarnish and corrosion resistance to a copper or copper alloy foil, particularly wrought foil having one surface roughened by the application of nodules or dendrites. The foil is treated with an aqueous solution of chromic acid and sulfuric acid. The foil may then be rinsed in a basic solution having a pH greater than 8 and then dried.

22 Claims, No Drawings

ANTI-TARNISH TREATMENT OF METAL FOIL

This application is a continuation of application Ser. No. 338,711, filed Apr. 14, 1989, now abandoned.

This application is related to copending U.S. application entitled, "Treatment of Metal Foil" by L. Lin and N. Polan Serial No. 333,212, filed Apr. 5, 1989 and copending U.S. application entitled, "Anti-Tarnish Treatment of Metal Foil" by L. Lin and N. Polan, Serial No. 333,210, filed Apr. 5, 1989.

The present invention relates broadly to the treating of metal foil to form a tarnish and oxidation resistant film thereon. More specifically the present invention relates to the treatment of copper and copper base alloy foil materials to prevent tarnishing.

One of the problems which faces manufacturers of both electrolytic and wrought copper and copper alloy materials is the tarnishing of the materials during storage and shipment. This tarnishing generally results from the exposure of the copper to normal atmospheric conditions. This tarnishing is aesthetically unpleasant as well as a potential source of serious problems during the manufacture of many products such as printed circuits. For example, tarnishing of copper foil prior to its lamination to a dielectric substrate can affect both the bond strength between the foil and the substrate material and the etching characteristics of the resultant laminate.

In the past, tarnish resistance has been imparted to copper and copper base alloy materials by immersion of the copper material in an electrolyte containing chromate ions. U.S. Pat. No. 3,625,844 to McKean describes a method of anti-tarnishing copper foil involving the electrolytic treatment of copper foil in an aqueous electrolyte under critical conditions of hexavalent chromium ion concentration, cathode current density, and treatment time. U.S. Pat. No. 3,853,716 to Yates et al discusses the McKean process and points out that it is not a completely satisfactory antitarnishing technique because a build-up of copper and chromium cations in the electrolyte bath interfere with the effectiveness of the antitarnishing. Yates et al attempt to overcome this problem by rendering the copper material cathodic as it passes through an aqueous electrolyte containing hexavalent chromium ion-containing anions and being of sufficient alkalinity to cause precipitation of copper and chromium cations. U.S. Pat. Nos. 4,131,517 to Mitsuo et al and 4,387,006 to Kajiwara et al illustrate still other chromate containing treatments for suppressing time dependent changes in color tone during storage. Still other antitarnishing techniques are illustrated in U.K. published patent applications 2,030,176A and 2,073,779A.

Solutions of phosphoric acid, chromic acid and/or their salts have also been applied to various materials in an attempt to impart tarnish and corrosion resistance to the material. U.S. Pat. Nos. 3,677,828, 3,716,427 and 3,764,400, all to Caule, illustrate the use of phosphoric acid solutions to improve the tarnish resistance of copper and copper base alloys. Caule also describes in his '400 patent the use of a basic rinse solution after application of his phosphoric acid treatment. Phosphoric and/or chromic acid solutions have also been applied to zinc, zinc-coated articles, and aluminum foil and articles. U.S. Pat. Nos. 2,030,601 to McDonald, 2,412,543 to Tanner, 2,418,608 to Thompson et al, 2,647,865 to Freud and 4,432,846 to Honeycutt III illustrate some of the applications of phosphoric-chromic acid solutions.

The treatment of copper or copper alloy foil for use in printed circuit applications creates a somewhat unique problem that limits the suitability of some antitarnishing treatments. In the manufacture of printed circuits, copper sheet or foil is bonded to a dielectric substrate. Prior to bonding, at least one surface of the copper foil is generally roughened or treated to improve the bond strength between the foil and the substrate. While there are a variety of techniques available to roughen or treat the foil surface, one of the most commonly used involves the formation of a plurality of copper or copper oxide nodules or dendrites on the foil surface. U.S. Pat. Nos. 4,468,293 and 4,515,671 both to Polan et al illustrate one such dendritic or nodular roughening treatment.

The primary deficiency of many antitarnishing treatments lies in the concentration of chromic and/or phosphoric acid and/or their salts in the antitarnishing solution. Where the antitarnishing solution contains relatively high concentrations of chromic and/or phosphoric acid and/or their salts, immersion of the treated copper foil in the solution may lead to dissolution of the nodules or dendritic particles which may result in relatively weak bond strength characteristics.

One tarnish resistant treatment which tends to overcome the problems mentioned above is described in U.S. Pat. No. 4,647,315 to Parthasaranthi and Polan. Briefly, the process disclosed in that patent comprises the immersion of the copper or copper alloy foil in a dilute aqueous solution of a mxxture of chromic acid and phosphoric acid followed by a rinse in a dilute basic solution having a pH greater than about 8.

While the anti-tarnish treatment described in U.S. Patent No. 4,647,315 has been found generally satisfactory, for some applications of the foil, the anti-tarnish treatment described in that patent has been found in some instances to be too resistant to removal. This is particularly true where only mild chemical cleaning procedures are used to prepare the laminated foil for photoresist lamination. It has been found that the anti-tarnish treatment according to U.S. Patent No. 4,647,315 is not easily removable from the foil surface, as for example, by immersion for 30 seconds in a 2 to 4 volume percent of a saturated solution of HCl at room temperature, which is an example of a mild cleaning procedure for a laminated foil for photoresist lamination. This results in the photoresist used to image the circuit traces not having consistent adhesion during further processing.

In accordance with the present invention, a technique is provided for providing treatment to copper foil which results in good tarnish resistance and peel strength for the foil, but is relatively easily removed to permit further treatment such as photoresist on that side.

The technique of the present invention involves applying a dilute aqueous chromic acid-sulfuric acid solution to the material followed by a rinse in a dilute basic solution having a pH greater than about 8.

Accordingly, it is an object of the present invention to provide a novel treatment useful in providing tarnish resistance to copper and copper base alloy materials.

It is a further object of the present invention to provide an anti-tarnish treatment for treating copper and copper alloy foil and rendering it more particularly suitable for use in printed circuit applications.

A still further object of the present invention is to provide an anti-tarnish treatment for treating copper or copper alloy foil which often has at least one surface roughened by the application of dendritic or nodular particles thereto, in which the anti-tarnish treatment may be removed from the surface or surfaces of the foil by mild cleaning procedures.

As previously noted, the present invention involves an improved non-electrolytic technique for providing copper and copper alloy foil materials with an anti-tarnish coating. As used herein, the term copper and copper alloy foil includes copper and copper base alloy sheet, strip, foil and slab materials. The present invention is particularly applicable to wrought copper foil which has at least one side treated to provide copper or copper oxide dendrites or nodules thereon. In accordance with the present invention, copper foil having the desired tarnish and oxidation resistance can be obtained by first immersing the copper foil in a dilute aqueous chromic acid-sulfuric acid solution and thereafter rinsing the foil in a dilute caustic solution.

The copper foil to be anti-tarnish treated may comprise any electrodeposited or wrought copper or copper alloy foil. When the foil is to be used for a printed circuit application, one surface of the foil may be treated to improve the adhesion properties of the foil. While any suitable treatment known in the art may be used to enhance the foil adhesion properties, it is preferred to electrolytically from a plurality of dendrites on the surface to be bonded to a substrate. Generally, the dendritic particles are formed in an electrolytic technique by immersing the copper or copper alloy foil in an aqueous electrolyte solution such as an aqueous sulfuric acid-copper sulfate solution and applying a cathodic current to the foil. Prior to forming the dendrites, the copper or copper alloy foil may be cleaned and/or have a copper strike layer formed thereon. The copper strike layer is applied where it is desirable to render the foil more electrochemically active and receptive to the subsequent roughening treatment. It has been discovered that by using a copper strike layer the number of unplated zones on the foil may be significantly reduced after the dendritic treatment. U.S. Pat. Nos. 4,468,293 and 4,549,950, to Polan et al, which are hereby incorporated by reference herein in their entirety, illustrate suitable techniques for roughening the copper or copper alloy foil surface and preparing the copper or copper alloy foil for use in printed circuit applications.

Upon completion of the roughening treatment, the treated foil is subjected to a wash to remove any unwanted impurities, loose particles and potential solution contaminants. The wash may comprise any suitable rinse treatment known in the art. If desired, the treated foil may be dried after washing and before application of the anti-tarnishing treatment of the present invention. Any suitable drying technique known in the art such as infra-red lamps or heated air may be used to dry the treated foil.

In accordance with the present invention, the treated copper or copper alloy foil is rendered tarnish resistant by applying a dilute aqueous chromic acid-sulfuric acid solution to the foil. An advantage to the present treatment is that the desired tarnish and oxidation resistance may be imparted to the copper or copper alloy foil without applying an electric current during treatment to either foil or the anti-tarnish solution. Additionally, the anti-tarnish treatment is removeable from the smooth side of the foil by conventional cleaning procedures such as immersion in HCl at room temperature to permit further processing of the foil.

Anti-tarnish solutions in accordance with the present invention may contain chromic acid in the concentration of about 0.02 grams per liter (hereinafter g/l) to about 5.0 g/l and sulfuric acid in the concentration in the range of about 0.02 g/l to about 20 g/l depending upon the temperature and length of time of treatment. Generally, the solution will contain no other constituents besides water and some minor impurities. Preferably, the solution consists essentially of from about 0.1 g/l to about 0.3 g/l of chromic acid, from about 0.02 g/l to about 0.7 g/l sulfuric acid and the balance essentially water.

While the anti-tarnish treatment of the present invention may be applied in any suitable manner including brushing and spraying, it is preferred to treat the foil by passing an elongated sheet of the foil through a tank containing the anti-tarnish solution. The tank may be formed from any suitable material and may have appropriate inlet(s) and outlet(s) for adding and withdrawing the anti-tarnish solution. The tank may also be provided with any suitable means known in the art such as a heating/cooling loop for maintaining the anti-tarnish solution at a desired temperature. A plurality of rolls may be mounted to and in the tank to define a path by which the foil tracks through the tank. For example, a plurality of rolls may be arranged to enable the foil to pass through the tank in a serpentine fashing. Any suitable means known in the art may be used to mount the rolls to and in the tank. The copper or copper alloy foil to be treated may be fed from a supply spool over the rolls into the anti-tarnish solution.

While this anti-tarnish treatment of the present invention may be applied with the chromic-sulfuric acid solution at any desired temperature, it is preferred to maintain the solution in the tank at a temperature in the range of about 20° C. to about 100° C. and most preferably from about 45° C. to about 75° C. It is also preferred to keep the foil immersed in the solution for a time in the range of about 1 second to about 120 seconds, most preferably from about 5 seconds to about 60 seconds. When other techniques such as spraying are used to apply the anti-tarnish solution, the foil should be exposed to the solution for similar time periods.

It has been found that the tarnish and oxidation resistance imparted to the foil is improved by rinsing the foil in a basic rinse solution immediately after the foil exits from the anti-tarnish treating tank. Dilute basic solutions in accordance with the present invention comprise aqueous solutions having a pH of at least 8. Solutions of particular benefit are those having a pH in the range of about 9 to 11.5. Any suitable addition agent may be employed to adjust the pH of this solution. Generally, the addition will be selected from the group consisting of the salts of alkali metals, the salts of alkaline earth metals, the hydroxides of the alkali metals, and the hydroxides of the alkaline earth metals. A preferred addition agent is selected from a group consisting of sodium hydroxide, calcium hydroxide, potassium hydroxide and ammonium hydroxide. While the amount of addition agent present in the solution will be a function of the desired pH level for the solutions, generally the addition agent will be present in a concentration of greater than 1 ppm.

The temperature of the basic solution may be maintained at a temperature in the range from room temperature to about 100.° C. and preferably between about 45°

C. to about 90° C. While the time of immersion of the foil in the basic solution may vary from about 1 second to about 120 seconds, most preferably it is immersed for about 5 seconds to about 60 seconds. It has been found that the use of the basic rinse solution after treatment with the chromic acid-sulfuric acid bath serves to enhance the anti-tarnish treatment.

The rinse solution may be applied to the anti-tarnish treated foil in any desired manner. For example, the rinse solution may be sprayed on the foil. Alternatively, the foil may be passed through a tank containing the rinse solution by means of rolls which may be mounted to and in the tank to define a path by which the foil tracks through the tank.

After the foil is rinsed in the basic rinse solution, it may then be dried and wound onto a take up reel. Numerous drying processes which may be used are well known in the art. One such process which may be used embodies a water blow-off stage followed by a hot air tunnel drying stage. An alternative process which may be used utilizes heated blow-off air for both bulk and evaporative water removal. In this latter process, the hot air can be directed against the foil when it is lying on rolls in the line. In still another alternative process, at least one internally heated drum roll or infra-red heating may be used to dry the foil.

To demonstrate the present invention, the following examples were performed:

EXAMPLE 1

Samples of wrought 1 oz/ft.$^2$ copper alloy C11000 foil, dentritically treated in a copper sulfate-sulfuric acid solution, were immersed in an aqueous solution containing 0.2 g/l of chromic acid and 0.05 g/l of sulfuric acid for 25 seconds. The solution was at a temperature of 120° F. The samples were then rinsed in a solution containing 50 ppm of Ca(OH)$_2$ for a period of 25 seconds. The temperature of the solution was 121° F. Tarnishing tests were conducted comprising exposing the samples to heated air at various temperature for 30 minutes. In case of samples according to this example, visual inspection of the appearance of the samples showed substantially no tarnish at 150° C./30 minutes and 160° C./30 minutes although tarnish was present on the samples tested at 175° C. for 30 minutes.

The samples were tested for removal of the tarnish-resistant coating by exposing the samples to fumes over a (NH$_4$)$_2$ S solution for 15 seconds after a 30 second cleaning procedure with a 4% by volume saturated HCl solution and a 2% by volume saturated HCl solution. In this case, the foil should tarnish thereby indicating the removal of the tarnish-resistant coating. The sulfide fume exposure test correlates with actual dry film photoresist adhesion. That is, if the foil is clean enough to tarnish in the sulfide fumes, it will also exhibit good bonding to the photoresist.

The samples subjected to the 4% by volume HCl/30 second cleaning treatment included a sample that was first subjected prior to cleaning to a 175° C. temperature in air for 30 minutes to simulate a lamination cycle which tends to increase the difficulty of removal of anti-tarnish treatments. Also included were samples subjected to, prior to cleaning, a 175° C. temperature in a nitrogen atmosphere for 30 minutes followed by a lamination cycle simulation of 30 minute exposure to air at a temperature of 175° C. A third sample was subjected to exposure to air at 150° C. for 30 minutes.

In the case of the 2% by volume saturated HCl cleaning treatment, one set of samples were cleaned "as received" while a second set were subjected prior to cleaning to the lamination cycle simulation by exposure to 175° C. in air for 30 minutes. After both the 4% and 2% HCl cleaning treatments, the samples exhibited tarnish.

As a further test, which is indicative of shelf life, samples treated according to this Example were subjected to 85% relative humidity at 100° F. for eight days. The samples did not exhibit tarnish.

EXAMPLE II

Samples of the type of Example I were immersed in an aqueous solution containing 0.2 g/l of chromic acid and 0.05 g/l of phosphoric acid for 25 seconds. The solution was at a temperature of 134° F. The samples were then rinsed in a solution containing 100 ppm of Ca(OH)$_2$ for a period of 25 seconds. The temperature of the solution was 167° F. Tarnishing tests were conducted as in the first experiment. In this case, visual inspection of the appearance of the samples showed substantially no tarnish at 150° C./30 minutes and 160° C./30 minutes, while there was a light tarnish at 175° C./30 minutes.

These samples were subjected to fumes over (NH$_4$)$_2$ S solution as in Example I. With the 4% by volume saturated HCl cleaning for 30 seconds, the foil which was subjected to a simulated lamination cycle of 30 minute exposure to air at 175° C. prior to cleaning treatment tarnished. The foil subjected to a 30 minute air treatment at 150° C. before cleaning also tarnished. There was minimal tarnish in the case of the sample which was treated for 30 minutes in a nitrogen environment at 175° C. followed by a simulated lamination cycle treatment at 175° C. for 30 minutes in air prior to cleaning.

In the case of cleaning by a 2% by volume saturated HCl solution for 30 seconds, the samples of this Example which were subjected to a simulated lamination cycle of 175° C./30 minute air treatment prior to the 2 percent by volume saturated HCl /30 seconds cleaning treatment exhibited moderate tarnishing. Moderate tarnishing was also observed where "as received" samples were cleaned with the 2% by volume saturated HCl solution for 30 seconds. No tarnish was preceived when the samples were subjected to 85% relatively humidity in 100° F. temperature for 8 days.

EXAMPLE III

By way of comparison, samples of wrought 1 oz/ft.$^2$ copper alloy C11000 foil, dentritically treated in a copper sulfate-sulfuric acid solution, were immersed in an aqueous solution containing 0.2 g/l of chromic acid and 0.50 g/l phosphoric acid for 25 seconds. The solution was at a temperature of 126° F. The samples were then rinsed in a solution containing 140 ppm of Ca(OH)$_2$ for a period of 25 seconds with the solution temperature being 181° F. With samples treated according to this Example, no tarnish was exhibited on the samples subjected to the 150° C./30 minute treatment, the 160° C./30 minute treatment, as well as the 175° C./30 minute treatment. Additionally, no tarnish was observed for samples treated at 85% relative humidity at 100° F. for 8 days. However, when subjected to fumes over (NH$_4$)$_2$ S solution for 15 seconds after the 4% by volume saturated HCl /30 seconds cleaning, only minimal tarnishing was observed for such samples under each of the conditions of prior treatment set forth in the previous Examples.

When samples according to this Example were cleaned with a 2% by volume saturated HCl /30 second treatment, no tarnish was observed on "as received" samples and only minimal tarnish was observed from the samples subjected to 175° C./30 minute air treatment prior to cleaning when subjected to fumes over $(NH_4)_2$ S solution for 15 seconds.

As shown by the above examples, the use of the chromic acid-sulfuric acid treatment provides the dentritically treated samples with substantially the same tarnish resistance as samples treated with the chromic acid-phosphoric acid solution especially the 160° C./30 minute test. The sulfide response test by exposure to fumes over $(NH_4)_2$ solution indicates that the use of the chromic acid-sulfuric acid as a tarnish-resistant treatment is more easily removable by an HCl cleaning treatment both at 4% by volume and 2% by volume as compared with the chromic acid-phosphoric acid treatment.

The U.S. patent applications and foreign patent documents described in the specification are intended to be incorporated by reference herein in their entirety.

It is apparent that there has been provided in accordance with this invention an anti-tarnishing technique for use with copper foil which fully satisfies the objects, means and advantages set forth herein before. The invention has been described in combination with specific embodiment thereof, it is evident that many alternatives, modifications and variations will be apparent to those skilled in the art in light of the forgoing description. Accordingly, it is intended to embrace all such alternations, modifications and variations as fall within the spirit and broad scope of the appended claims.

What is claimed:

1. A process for imparting tarnish and oxidation resistance to copper and copper alloy foil material, said process comprising:
    applying a dilute aqueous chromic acid-sulfuric acid solution to said material, said solution having a concentration of chromic acid in the range of about 0.02 g/l to about 5 g/l and a concentration of sulfuric acid in the range of about 0.02 g/l to about 20 g/l.

2. The process of claim 1 further comprising:
rinsing said material after applying said solution.

3. The process of claim 2 further comprising:
drying said material after said rinsing step.

4. The process of claim 2 wherein said rinsing step comprises:
    applying an aqueous rinse solution have a pH greater than about 8 to said material.

5. The process of claim 2 wherein said rinsing step comprises:
    applying an aqueous rinse solution having a pH greater than about 9 to about 11.5 and a temperature in the range of about room temperature to about 100° C. to said material.

6. The process of claim 5 wherein said rinsing solution contains at least 1 ppm of a material selected from the group consisting of the salts of alkali metals, the salts of alkaline earth metals, the hydroxides of the alkali metals, and the hydroxides of the alkaline earth metals.

7. The process of claim 5 wherein said rinsing solution contains at least 1 ppm of a material selected from the group consisting of the salts of calcium hydroxide, sodium hydroxide, potassium hydroxide, and ammonium hydroxide.

8. The process of claim 1 wherein said applying step comprises:
    immersing said material in said dilute solution for a time i the range of about 1 second to about 120 seconds.

9. The process of claim 1 wherein said applying step comprises:
    immersing said material in said dilute solution while said solution is at a temperature in the range of about 20° C. to about 100° C. for a time period in the range of about 1 seconds to about 120 seconds.

10. The process of claim 1 wherein said applying step comprises:
    immersing said material in a solution containing from about 0.1 g/l to about 0.3 g/l of said chromic acid and from about 0.02 g/l to about 0.7 g/l of said sulfuric acid.

11. The process of claim 1 wherein said applying step comprises:
spraying said dilute solution onto said material.

12. The process of claim 1 further comprising:
    roughening at least one surface of said material prior to said applying step, said roughening step comprising forming a plurality of dendritic particles on said at least one surface.

13. A treatment for imparting improved tarnish and oxidation resistance to copper and copper alloy material, said treatment comprising a anti-tarnish solution containing from about 0.02 g/l to about 5 g/l of chromic acid, from about 0.02 g/l to about 20 g/l of sulfuric acid and the balance essentially water.

14. The treatment of claim 13 further comprising:
    said chromic acid concentration in said solution being in the range of about 0.1 g/l to about 0.3 g/l and said sulfuric acid concentration in said solution being in the range of about 0.02 g/l to about 0.7 g/l.

15. The treatment of claim 13 further comprising:
    a aqueous caustic rinse solution having a pH greater than about 8, said rinse solution being applied to said material after application of said anti-tarnishing solution.

16. The treatment of claim 15 wherein said rinse solution has a pH in the range of about 9 to about 11.5 and a temperature in the range of about room temperature to about 100° C.

17. The process of claim 15 wherein said rinsing solution contains at least 1 ppm of a material selected from the group consisting of the salts of alkali metals, the salts of alkaline earth metals, the hydroxides of the alkali metals, and the hydroxides of the alkaline earth metals.

18. The treatment of claim 17 wherein said rinse solution contains at least about 1 ppm of a material selected from the group consisting of calcium hydroxide, sodium hydroxide, potassium hydroxide and ammonium hydroxide.

19. A process for imparting tarnish and oxidation resistance to copper and copper alloy foil material having a plurality of dendritic particles on at least one surface, said process comprising:
    applying a dilute aqueous chromic acid-sulfuric acid solution to said material having said plurality of dendritic particles, said solution having a concentration of chromic acid in the range of about 0.02 g/l to about 5.0 g/l and a concentration of sulfuric acid in the range of from about 0.02 g/l to about 20 g/l.

20. The process of claim 19 further comprising:

applying an aqueous rinse solution having a pH greater than about 8 to said material after said dilute aqueous chromic acid-sulfuric acid solution application.

21. The process of claim 19 further comprising:
rinsing said material in an aqueous rinse solution having a pH in the range of from about 9 to about 11.5 and a temperature in the range of from 20° C. to about 100° C., said solution containing at least about 1 ppm of a material selected from the group consisting of calcium hydroxide, sodium hydroxide, potassium hydroxide, and ammonium hydroxide.

22. The process of claim 19 wherein said solution applying step comprises:
immersing said material in a solution at a temperature in the range of from about 20° C. to about 100° C. for a time period in the range of about 1 seconds to about 120 seconds, said solution containing from about 0.02 g/l to about 5.0 g/l of said chromic acid and from about 0.02 g/l to about 20 g/l of said sulfuric acid.

* * * * *

UNITED STATES PATENT AND TRADEMARK OFFICE
CERTIFICATE OF CORRECTION

PATENT NO. : 4,952,285

DATED : August 28, 1990

INVENTOR(S) : Lifun Lin and Ned W. Polan

It is certified that error appears in the above—identified patent and that said Letters Patent is hereby corrected as shown below:

At Column 2, line 27, delete "Parthasaranthi" and insert --Parthasarathi--.

At Column 2, line 30, delete "mxxture" and insert --mixture--.

At Column 3, line 28, delete "from" and insert --form--.

At Column 4, line 29, delete "fashing" and insert --fashion--.

At Column 5, line 32, delete "dentritically" and insert --dendritically--.

At Column 6, line 32, delete "tarnished. The" and insert --tarnished, the--.

At Column 6, line 47, delete "preceived" and insert --perceived--.

At Column 6, line 48, delete "relatively" and insert --relative--.

UNITED STATES PATENT AND TRADEMARK OFFICE
CERTIFICATE OF CORRECTION

PATENT NO. : 4,952,285

DATED : August 28, 1990

INVENTOR(S) : Lifun Lin and Ned W. Polan

It is certified that error appears in the above—identified patent and that said Letters Patent is hereby corrected as shown below:

At Column 7, line 16, after "$(NH_4)_2$", insert --S--.

At Column 7, Claim 4, line 3, delete "have" and insert --having--.

At Column 8, Claim 8, line 4, delete "i" and insert --in--.

At Column 8, Claim 9, line 6, delete "seconds" and insert --second--.

At Column 8, Claim 13, line 3, delete "a" and insert --an--.

At Column 8, Claim 15, line 2, delete "a" and insert --an--.

At Column 10, Claim 22, line 5, delete "seconds" and insert --second--.

Signed and Sealed this

Eleventh Day of August, 1992

Attest:

DOUGLAS B. COMER

*Attesting Officer*  *Acting Commissioner of Patents and Trademarks*